(12) United States Patent
Wang

(10) Patent No.: US 7,057,957 B2
(45) Date of Patent: Jun. 6, 2006

(54) HIGH SPEED AND LOW POWER SENSE AMPLIFIER

(75) Inventor: Chin-Huang Wang, Ping-Zhen (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 103 days.

(21) Appl. No.: 10/810,966

(22) Filed: Mar. 26, 2004

(65) Prior Publication Data

US 2005/0213406 A1    Sep. 29, 2005

(51) Int. Cl.
   *G11C 7/06*    (2006.01)
(52) U.S. Cl. ............... 365/207; 365/203; 365/205; 327/51; 327/52
(58) Field of Classification Search ................. None
   See application file for complete search history.

(56) References Cited

U.S. PATENT DOCUMENTS 4,592,026 A * 5/1986 Matsukawa et al. ........ 365/203
5,418,753 A * 5/1995 Seki ........................... 356/222
5,815,442 A * 9/1998 Aimoto et al. ......... 365/189.01
6,154,394 A * 11/2000 Hirabayashi ............ 365/189.05
6,249,470 B1   6/2001 Andersen et al. ........... 365/207
6,301,179 B1  10/2001 Lawson ....................... 365/207
6,363,023 B1   3/2002 Andersen et al. ........... 365/207

* cited by examiner

Primary Examiner—Tan T. Nguyen

(57) ABSTRACT

This invention provides a circuit and a method for limiting the power consumed by memory array sense amplifiers while enhancing the speed of memory systems. It provides a circuit and a method which automatically limits the precharge time and voltage, which limits the power consumed and speeds the voltage transitions. The invention automatically disables the data line precharge right after achieving the trip point of the first inverter of the sense output circuit. This is the essence of the automatic saving of power consumption. In addition, the circuit and method of this invention provide for faster access speed, since the data line precharge and voltage swing are limited. Also, the circuit and method of this invention allow for smaller integrated circuit layout area due to no required reference circuit and no required circuit for generating the precharge period.

50 Claims, 3 Drawing Sheets

HIGH SPEED AND LOW POWER SENSE AMPLIFIER

BACKGROUND OF THE INVENTION

1. Field of the Invention

The present invention generally relates to the general problem of limiting the power consumed by memory array sense amplifiers. More particularly, this invention presents a circuit and a method for providing a high speed and low power sense amplifier. More particularly, this invention provides a circuit and a method which automatically limits the precharge time and voltage, which limits the power consumed and speeds the voltage transitions.

2. Description of the Prior Art

A typical dynamic random access memory, DRAM, contains several subsystem circuits which make up the whole memory system. For example, there is the address decode subsystem which takes the memory address bus as input and outputs word lines which select groups of memory cells for writing and reading. In addition, there are input data drivers which interface with the memory array data bit lines for purposes of writing new data into the memory cells. Then, there are the memory arrays themselves which are made up of memory cells. For purposes of reading previously stored data out of the memory cells, there is a sense amplifier subsystem. This subsystem senses the data level of bit lines in order to report or read the value of memory cells. The sense amplifier circuitry interfaces with bits lines which are attached to the memory cells and with data output drivers which are the output lines of the memory system. In the prior art, the power dissipation and speed of sense amplifiers are important design issues, since any improvement to power consumed by sense amplifies and in the speed of sense amplifiers are magnified several times due to the widespread use of dynamic random access memory, DRAM.

U.S. Pat. No. 6,363,023 (Anderson, et al.) "Bi-directional Differential Low Power Sense Amp and Memory System" describes a device and a method which reduces power consumption in memory devices. It describes a bi-directional circuit which can be used for both read and write operations.

U.S. Pat. No. 6,301,179 (Lawson) "Self-equalized Low Power Precharge Sense Amp for High Speed SRAMs" discloses memory sense amplifier subsystem which uses complementary PMOS FETs and NMOS FETs.

U.S. Pat. No. 6,249,470 (Anderson, et al.) "Bi-directional Differential Low Power Sense Amp and Memory System" discloses a sense amplifier subsystem which utilizes differential data buses which further reduces power consumption while providing high performance.

SUMMARY OF THE INVENTION

It is an object of the present invention to provide a circuit and a method for a circuit and a method for providing a high speed and low power sense amplifier. It is further an object of this invention to provide a circuit and a method which automatically limits the precharge time and voltage, which limits the power consumed and speeds the voltage transitions.

The objects of this invention are achieved by a high speed and low power sense amplifier circuit made up of a precharge circuit, which interfaces with a sense-enable circuit, a sense output circuit, and control logic circuitry, a sense enable circuit, which interfaces with the precharge circuit, said sense output circuit, and the control logic circuitry, a sense output circuit, which interfaces with memory cell bit lines, the precharge circuit, the sense enable circuit, and the control logic circuitry, and control logic circuitry. The precharge circuit is made up of two n-channel metal-oxide semiconductor field effect transistors, NMOS FETs, and one p-channel metal-oxide semiconductor field effect transistor, PMOS FET. The sense enable circuit is made up of three NMOS FETS. The sense output circuit consists of three serially connected inverters. The control circuitry consists of three inverters and two NOR circuits. The control circuitry has two primary inputs, a precharge of the output signal of the control circuit, a sense enable signal, and a sense output signal. The control circuitry has three primary outputs, an inverted precharge signal, an inverted sense enable signal, and a latched precharge signal. The precharge circuit has three inputs, a precharge signal and its inverse, and a sense enable signal. The precharge circuit has an output, the precharge signal, Vs. The sense enable circuit has three inputs, a sense enable signal and its inverse, and a word line signal. The sense enable circuit has an output, a data line. The sense output circuit has a sense input and a sense output. The NMOS FET in the precharge circuit has its gate attached to the precharge signal its drain connected to a positive power supply and its source connected to the drain of a second NMOS device in the precharge circuit. The second NMOS FET in the precharge circuit has its gate attached to the sense enable signal, its drain connected to the source of the first NMOS FET of the precharge circuit and its source connected to a node, which feeds the input of the sense output circuit and which feeds the drain of a first NMOS device in the sense enable circuit. The first PMOS FET in the precharge circuit has its source attached to the Vdd power supply, its gate attached to the precharge signal and its drain connected to the node, which feeds the sense output circuit. The first NMOS FET in the sense enable circuit has its drain connected to the source of the second NMOS FET of the precharge circuit its source connected to a data line of a memory away, and its gate connected to a sense enable signal. The second NMOS FET of the sense enable circuit has its drain connected to the data line of the memory array, its gate connected to a word line and its source connected to ground. The third NMOS FET of the sense enable circuit has its drain connected to the node, which is the input to the sense output circuit, its source is connected to ground and its gate is connected to an inverse of the sense enable signal. The sense enable signal feeds an inverter in the control logic to produce said inverted sense enable signal. The precharge signal comes from a latch circuit within the control circuit. The latch in the control circuit consists of two 2-input NORs whose outputs feed the other NORs inputs. The sense enable signal in the control circuit feeds an inverter to produce an inverted sense enable signal, which feeds a first 2-input NOR circuit. The sense output signal in the control circuit feeds an inverter to produce an inverted sense output signal, which feeds a second 2-input NOR circuit. The 2-input NORs has the inverted sense enable signal as an input. The 2-input NOR circuit has the inverted sense output signal as an input.

The above and other objects, features and advantages of the present invention will be better understood from the following detailed description taken in conjunction with the accompanying drawings.

DESCRIPTION OF THE PREFERRED EMBODIMENT

Figure 1:
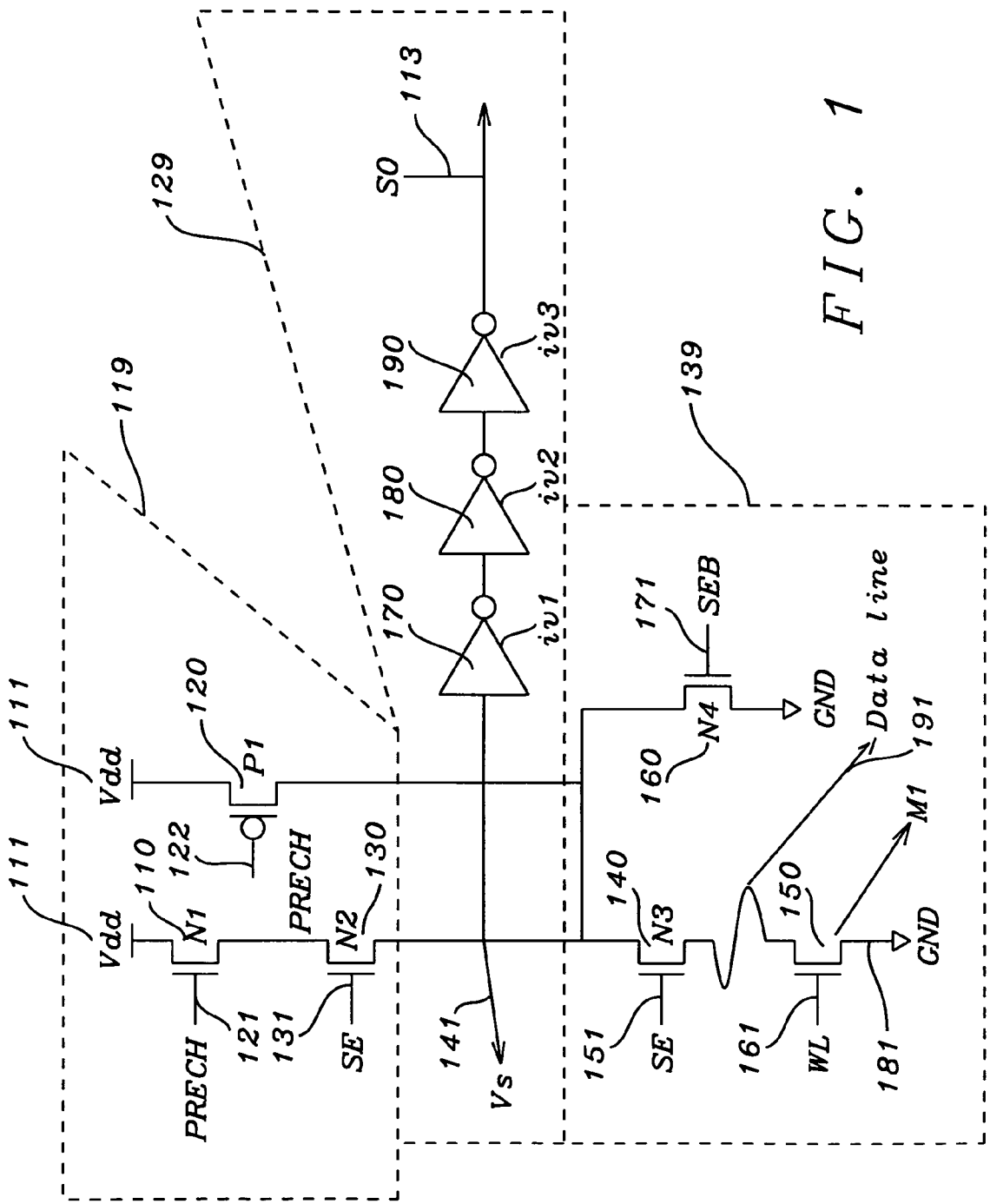
FIG. 1 shows the main embodiment circuit of this invention.

FIG. 1 shows the main embodiment of the circuit of this invention. This figure shows four sub-circuits. There is a precharge circuit 119 consisting of two n-channel metal oxide semiconductor field effect transistors 110, 130 NMOS FETs and one p-channel metal oxide semi-conductor field effect transistor 120.

The sense enable circuit 139 consists of three NMOS FETS 140, 150, and 160. The sense output circuit 129 consists of three serially connected inverters 170, 180, and 190.

Returning to the precharge circuit, the NMOS device 110 has its drain connected to the Vdd power supply 111, its source connected to the drain of NMOS device 130, and its gate is connected to the primary input signal, PRECH 121, the precharge control signal. NMOS device 130 has its drain connected to said source of said NMOS device 110, its source is connected to the Vs node 141, which is the input of the sense output circuit 129. PMOS device 120 has its source connected to the Vdd power supply, its drain is connected to the Vs node 141, and its gate is connected to the precharge signal.

In the sense enable circuit 139, the NMOS device 140 has its drain connected to the Vs 141 node in FIG. 1. It has its source connected to a memory away data line 191 and its gate connected to the Sense Enable line, SE 151. Also, in the sense enable cirucit 139, a second NMOS device 160 has its drain connected to the Vs node 141, its source is connected to ground and its gate is connected to the inverse sense enable signal, SEB 171.

Also in the sense enable circuit 139, a third NMOS device 150 has its drain connected to the memory away data line 191, its source connected to ground, and its gate connected to a word line WL signal 161. Typically, the Word Line WL signals 161 come from memory address decode circuits, which select specific memory away words or groups of data bit lines.

FIG. 1 also has the sense output circuit, which contains three serially connected inverters 170, 180, and 190. The output of this circuit is the sense output SO 113. This sense output 113 typically feeds a memory output data buffer in order to present the results of a memory read to the outside world.

Figure 2:
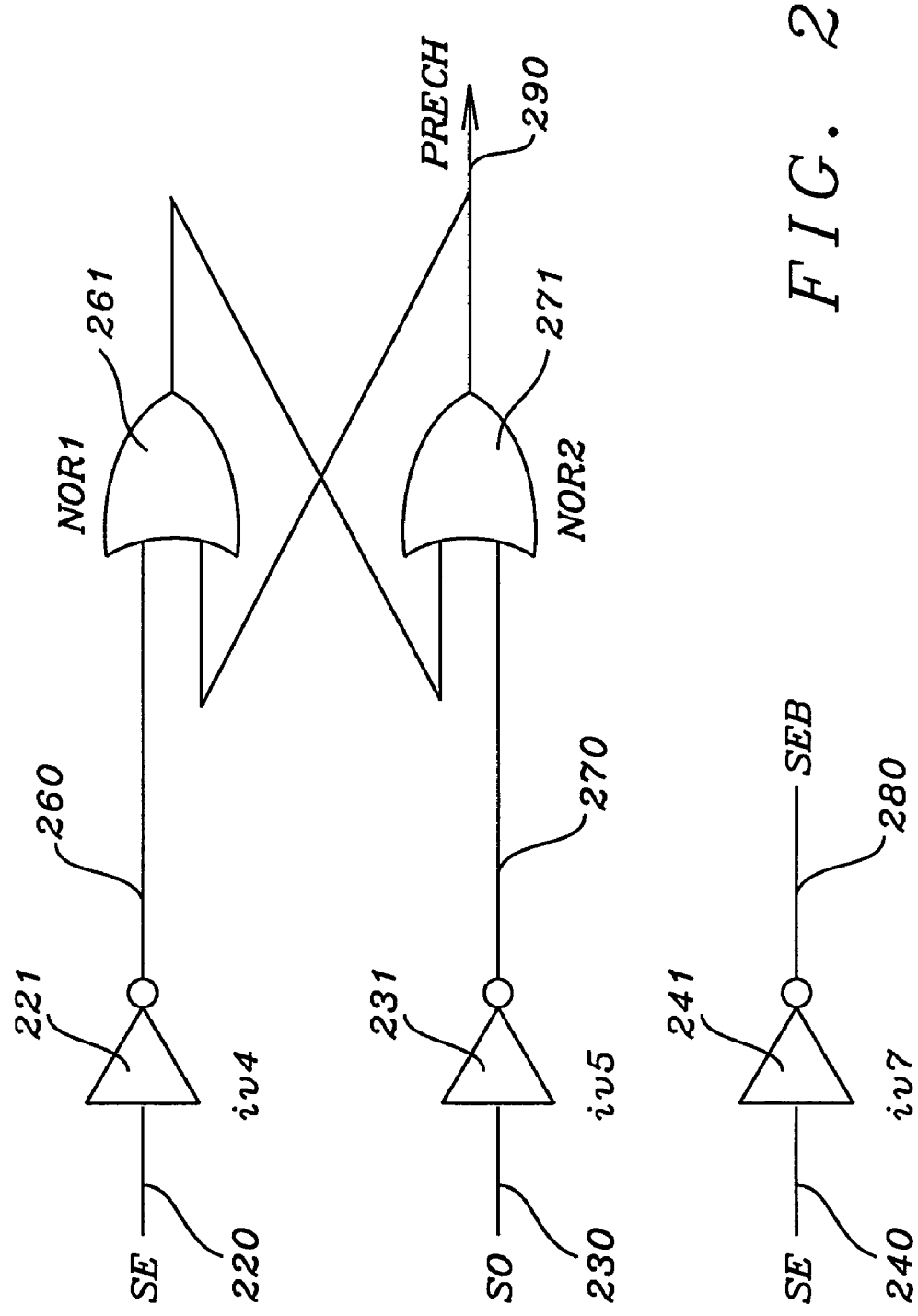
FIG. 2 shows the control circuitry of the main embodiment of this invention.

FIG. 2 presents the control logic embodiment for this invention. The precharge signal, PRECH, 210 is passed throughan inverter 211 to produced PRECHB, an inverted precharge control signal 250, which is used in the circuit of FIG. 1. P1 is enabled after PRECH goes low. The sense enable signal, SE, 240, is passed through an inverter 241 to produce SEB, an inverted sense enable control signal 280, which is used in the circuit of FIG. 1.

FIG. 2 also shows a control circuit, which generates the precharge, PRECH signal 290. The sense enable, SE 220 and sense output, SO 230 feed inverters 221 and 231. The outputs 260 and 270 of these two inverters 221 and 231 feed two 2-input NOR circuits are fed from the feedback outputs of the other NOR circuit in a latch connection format.

Figure 3:
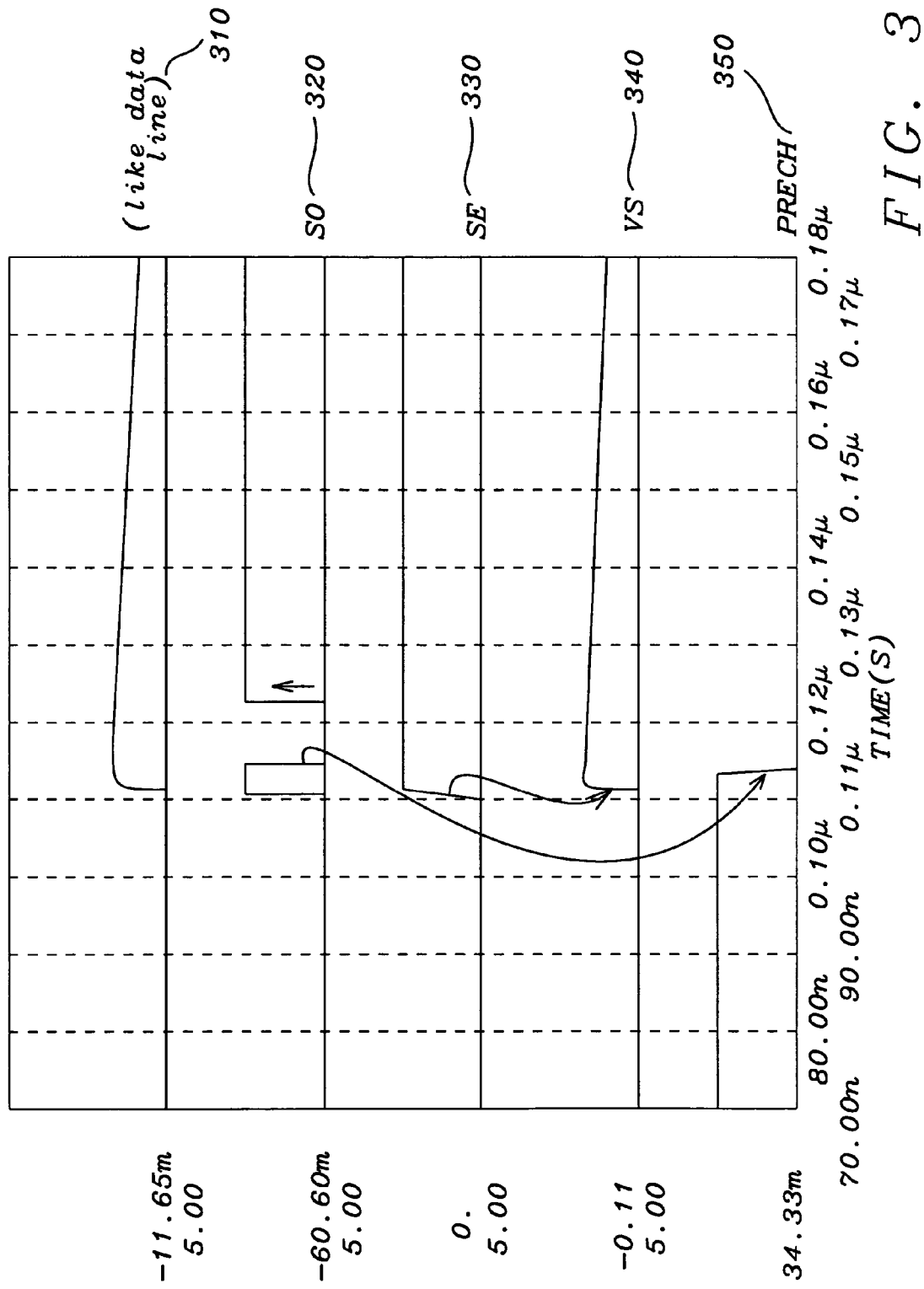
FIG. 3 shows a timing diagram which illustrates the operation of the key control and data signals of this invention.

FIG. 3 shows a timing diagram, which illustrates the operation of the circuitry in FIGS. 1 and 2. FIG. 3 illustrates the reading of a '1' value from the memory away. First, the precharge signal 350 is High. Before the precharge signal falls, it overlaps the sense enable, SE 330 signal for a portion of time. This causes the Vs signal 340 to go High.

The sense output signal, which initially follows and is the inverse of the Vs signal 340 in FIG. 3, goes low when the Vs 340 signal is precharged. When the word line is active simultaneously with the sense enable, SE signal 330, the data line goes low if a '1' is stored in the memory cell. When the data line 191 goes low in FIG. 1, the Vs node 141 goes low. This causes the sense output 113 to go high as shown in FIG. 1. In FIG. 3, the SO waveform can also be seen 320 going high due to the cell current if the cell='1'. This completes the successful reading of a '1' from the memory using the sense amplifier of this invention.

In FIG. 1, before the sense enable, SE 131 signal goes high, the Vs 141 node is low and the PRECH 121 line is high. When SE goes high, the Vs 141 or data line is precharged through devices N1 (110) and N2 (130). The control circuit of FIG. 2 causes the PRECH signal 290 to go low right after Vs 141 goes higher than the trip point of inverter iv1 (170). The high level of Vs 141 is maintained via PMOS device P1 (120) in FIG. 1. P1 supplies current to node Vs 141. If there were cell current through device M1 larger than the current through device P1, the sense output SO is high to cause a Read Out of a '1'. If there were no cell current or the current through device m1 150 is smaller than the current through device P1 (120), the sense output, SO (113) is low.

The main point of this invention is as follows. The control circuit of FIG. 2 disables the dateline precharge right after achieving the trip point of the inverter 170 in FIG. 1. This quick and automatic disabling of the data line precharge allows the main embodiment of this invention to achieve high speed and low power consumption.

The precharge signal is turned off automatically as a function of the sense output, SO level by the control circuit of FIG. 2. This allows the precharge circuit to be turned off automatically. Therefore, it is not necessary to have the precharge circuit generate the precharge period. It is easy to achieve low power or high speed by adjusting 1 inverter size. The size of iV1 is adjusted to achieve low power or high speed.

The other key to this invention is that the precharge period of each sense amplifier is independently designed and controlled to prevent bitline over or under precharge. This allows the optimization of speed and/or power consumption.

The advantage of this invention is the lower power consumption achieved by the automatic adjustment and limitation of circuit precharge time. The circuit of this invention automatically disables the data line precharge right after achieving the trip point of the first inverter of the sense output circuit. This is the essence of the automatic saving of power consumption.

In addition, the circuit and method of this invention provide for faster access speed, since the data line precharge and voltage swing are limited. Therefore, the voltage transitions from '1' to '0' and '0' to '1' are limited by the limited precharging of nodes.

Also, the circuit and method of this invention allow for smaller integrated circuit layout area due to no reference circuit requirement. In addition, there is no need a circuit for generating a precharge period.

In addition, another big advantage is that the precharge period of each sense amplifier circuit of a memory has independent sense amplifier device sizes. These independent sense amp device sizes are selected to prevent bitline over/under precharge for the specific memory bit lines being Read out of the memory array.

While the invention has been described in terms of the preferred embodiments, those skilled in the art will recognize that various changes in form and details may be made without departing from the spirit and scope of the invention.

What is claimed is:

1. A high speed and low power sense amplifier circuit comprising:
   a precharge circuit, which interfaces with a sense-enable circuit, a sense output circuit, and control logic circuitry,
   a sense enable circuit, which interfaces with said precharge circuit, said sense output circuit, and said control logic circuitry,
   a sense output circuit, which interfaces with memory cell bit lines, said precharge circuit, said sense enable circuit, and said control logic circuitry, and control logic circuitry.

2. The high speed and low power sense amplifier circuit of claim 1 wherein said precharge circuit is made up of two n-channel metal-oxide semiconductor field effect transistors, NMOS FETs, and one p-channel metal-oxide semiconductor field effect transistor, PMOS FET.

3. The high speed and low power sense amplifier circuit of claim 1 wherein said sense enable circuit is made up of three NMOS FETs.

4. The high speed and low power sense amplifier circuit of claim 1 wherein said sense output circuit consists of three serially connected inverters.

5. The high speed and low power sense amplifier circuit of claim 1 wherein said control circuitry consists of three inverters and two NOR circuits.

6. The high speed and low power sense amplifier circuit of claim 1 wherein said control circuitry has two primary inputs; a sense enable signal, and a sense output signal.

7. The high speed and low power sense amplifier circuit of claim 1 wherein said control circuitry has two primary outputs; an inverted sense enable signal, and a latched precharge signal.

8. The high speed and low power sense amplifier circuit of claim 1 wherein said precharge circuit has two inputs; a precharge signal and a sense enable signal.

9. The high speed and low power sense amplifier circuit of claim 1 wherein said precharge circuit has an output, the precharge signal, Vs.

10. The high speed and low power sense amplifier circuit of claim 1 wherein said sense enable circuit has three inputs; a sense enable signal and its inverse, and a word line signal.

11. The high speed and low power sense amplifier circuit of claim 1 wherein said sense enable circuit has an output, a data line.

12. The high speed and low power sense amplifier circuit of claim 1 wherein said sense output circuit has a sense input and a sense output.

13. The high speed and low power sense amplifier circuit of claim 2 wherein said first NMOS FET in said precharge circuit has its gate attached to said precharge signal its drain connected to a positive power supply and its source connected to the drain of a second NMOS FET said precharge circuit.

14. The high speed and low power sense amplifier circuit of claim 13 wherein said second NMOS FET in said precharge circuit has its gate attached to said sense enable signal, its drain connected to said source of said first NMOS FET of said precharge circuit and its source connected to a node, which feeds the input of said sense output circuit and which feeds the drain of a first NMOS device in said sense enable circuit.

15. The high speed and low power sense amplifier circuit of claim 14 wherein said PMOS FET in said precharge circuit has its source attached to said Vdd power supply, its gate attached to said precharge signal and its drain connected to said node, which feeds said sense output circuit.

16. The high speed and low power sense amplifier circuit of claim 2 wherein a first NMOS FET in said sense enable circuit has its drain connected to said source of a second one of the NMOS FETs of said precharge circuit, its source connected to a data line of a memory array, and its gate connected to a sense enable signal.

17. The high speed and low power sense amplifier circuit of claim 16 wherein said second NMOS FET of said sense enable circuit has its drain connected to said data line of said memory array, its gate connected to a word line and its source connected to ground.

18. The high speed and low power sense amplifier circuit of claim 14 wherein an NMOS FET of said sense enable circuit has its drain connected to said node, which is said input to said sense output circuit, its source as connected to ground, and its gate is connected to an inverse of said sense enable signal.

19. The high speed and low power sense amplifier circuit of claim 7 wherein said sense enable signal feeds an inverter in said control logic to produce said inverted sense enable signal.

20. The high speed and low power sense amplifier circuit of claim 7 wherein said precharge signal comes from a latch circuit within said control circuit.

21. The high speed and low power sense amplifier circuit of claim 20 wherein said latch in said control circuit consists of two 2-input NORs, each having an output that feeds an input of the other NOR.

22. The high speed and low power sense amplifier circuit of claim 1 wherein a sense enable signal in said control circuit feeds an inverter to produce an inverted sense enable signal, which feeds a first 2-input NOR circuit.

23. The high speed and low power sense amplifier circuit of claim 22, wherein a sense output signal in said control circuit feeds an inverter to produce an inverted sense output signal, which feeds a second 2-input NOR circuit.

24. The high speed and low power sense amplifier circuit of claim 23, wherein one of said 2-input NORs has said inverted sense enable signal as an input.

25. The high speed and low power sense amplifier circuit of claim 24, wherein the other said 2-input NOR circuit has said inverted sense output signal as an input.

26. A method of developing a high speed and low power sense amplifier circuit comprising the steps:
   providing a precharge circuit, which interfaces with a sense-enable circuit, a sense output circuit, and control logic circuitry,
   providing a sense enable circuit, which interfaces with said precharge circuit, said sense output circuit, and said control logic circuitry,
   providing a sense output circuit, which interfaces with memory cell bit lines, said precharge circuit, said sense enable circuit, and said control logic circuitry, and
   providing control logic circuitry.

27. The method of developing a high speed and low power sense amplifier circuit of claim 26, wherein said precharge circuit is made up of two n-channel metal-oxide semiconductor field effect transistors, NMOS FETs, and one p-channel metal-oxide semiconductor field effect transistor, PMOS FET.

28. The method of developing a high speed and low power sense amplifier circuit of claim 26, wherein said sense enable circuit is made up of three NMOS FETS.

29. The method of developing a high speed and low power sense amplifier circuit of claim 26, wherein said sense output circuit consists of three serially connected inverters.

30. The method of developing a high speed mud low power sense amplifier circuit of claim 26, wherein said control circuitry consists of three inverters and two NOR circuits.

31. The method of developing a high speed and low power sense amplifier circuit of claim 26, wherein said control circuitry has two primary inputs; a sense enable signal, and a sense output signal.

32. The method of developing a high speed and low power sense amplifier circuit of claim 26, wherein said control circuitry has two primary outputs; an inverted sense enable signal, and a latched precharge signal.

33. The method of developing a high speed and low power sense amplifier circuit of claim 26, wherein said precharge circuit has two inputs; a precharge signal and a sense enable signal.

34. The method of developing a high speed and low power sense amplifier circuit of claim 33, wherein said precharge circuit has an output; the precharge signal, Vs.

35. The method of developing a high speed and low power sense amplifier circuit of claim 26, wherein said sense enable circuit has three inputs; a sense enable signal and its inverse, and a word line signal.

36. The method of developing a high speed and low power sense amplifier circuit of claim 26, wherein said sense enable circuit has a data line as an output.

37. The method of developing a high spend and low power sense amplifier circuit of claim 26, wherein said sense output circuit has a sense input and a sense output.

38. The method of developing a high speed and low power sense amplifier circuit of claim 27 wherein a first one of the NMOS FETs in said precharge circuit has its gate connected to receive a precharge signal, its drain connected to a positive power supply and us source connected to the drain of a second one of the NMOS FETs in said precharge circuit.

39. The method of developing a high speed and low power sense amplifier circuit of claim 38, wherein said second NMOS FET in said precharge circuit has its gate attached to said sense enable signal, its drain connected to said source of said first NMOS FET of said precharge circuit and its source connected to anode, which feeds the input of said sense output circuit and which feeds the drain of a first NMOS device in said sense enable circuit.

40. The method of developing a high speed and low power sense amplifier circuit of claim 39, wherein said first PMOS FET in said precharge circuit has its source attached to a Vdd power supply, its gate attached to said precharge signal and its drain connected to said node, which feeds said sense output circuit.

41. The method of developing a high speed and low power sense amplifier circuit of claim 27 wherein a first NMOS FET in said sense enable circuit has its drain connected to a source of said second NMOS FET of said precharge circuit its source connected to a data line of a memory array, and its gate connected to receive a sense enable signal.

42. The method of developing a high speed and low power sense amplifier circuit of claim 41, wherein a second NMOS FET of said sense enable circuit has its drain connected to said data line of said memory array, its gate connected to a word line and its source connected to ground.

43. The method of developing a high speed and low power sense amplifier circuit of claim 42, wherein a third NMOS FET of said sense enable circuit has its drain connected to said node, which is said input to said sense output circuit, its source is connected to ground and its gate is connected to an inverse of said sense enable signal.

44. The method of developing a high speed and low power sense amplifier circuit of claim 41, wherein said sense enable signal feeds an inverter in said control logic to produce said inverted sense enable signal.

45. The method of developing a high speed and low power sense amplifier circuit of claim 31, wherein said precharge signal comes from a latch circuit within said control circuit.

46. The method of developing a high speed and low power sense amplifier circuit of claim 45, wherein said latch in said control circuit consists of two 2-input NORs whose outputs feed the other NORs inputs.

47. The method of developing a high speed and low power sense amplifier circuit of claim 26, wherein a sense enable signal in said control circuit feeds an inverter to produce an inverted sense enable signal, which feeds a first 2-input NOR circuit.

48. The method of developing a high speed and low power sense amplifier circuit of claim 47, wherein a sense output signal in said control circuit feeds an inverter to produce an inverted sense output signal, which feeds a second 2-input NOR circuit.

49. The method of developing a high speed and low power sense amplifier circuit of claim 48, wherein one of said 2-input NORs has said inverted sense enable signal as an input.

50. The method of developing a high speed and low power sense amplifier circuit of claim 49, wherein the other said 2-input NOR circuit has said inverted sense output signal as an input.

* * * * *

UNITED STATES PATENT AND TRADEMARK OFFICE
CERTIFICATE OF CORRECTION

| | | |
|---|---|---|
| PATENT NO. | : 7,057,957 B2 | Page 1 of 1 |
| APPLICATION NO. | : 10/810966 | |
| DATED | : March 26, 2004 | |
| INVENTOR(S) | : Chin-Huang Wang | |

It is certified that error appears in the above-identified patent and that said Letters Patent is hereby corrected as shown below:

Column 5, line 36, delete "inputs;" and insert therefore -- inputs: --.
Column 5, line 39, delete "outputs;" and insert therefore -- outputs: --.
Column 5, line 42, delete "inputs;" and insert therefore -- inputs: --.
Column 5, line 48, delete "inputs;" and insert therefore -- inputs: --.
Column 6, line 13, delete "gale" and insert therefore -- gate --.
Column 6, line 23, delete "as" and insert therefore -- is --.
Column 7, line 10, delete "mud" and insert therefore -- and --.
Column 7, line 16, delete "inputs;" and insert therefore -- inputs: --.
Column 7, line 20, delete "outputs;" and insert therefore -- outputs: --.
Column 7, line 24, delete "inputs;" and insert therefore -- inputs: --.
Column 7, line 28, delete "output;" and insert therefore -- output: --.
Column 7, line 31, delete "inputs;" and insert therefore -- inputs: --.
Column 7, line 36, delete "spend" and insert therefore -- speed --.
Column 7, line 43, delete "us" and insert therefore -- its --.
Column 7, line 50, delete "anode" and insert therefore -- a node --.

Signed and Sealed this

Tenth Day of July, 2007

JON W. DUDAS
*Director of the United States Patent and Trademark Office*

UNITED STATES PATENT AND TRADEMARK OFFICE
CERTIFICATE OF CORRECTION

PATENT NO. : 7,057,957 B2  
APPLICATION NO. : 10/810966  
DATED : June 6, 2006  
INVENTOR(S) : Chin-Huang Wang It is certified that error appears in the above-identified patent and that said Letters Patent is hereby corrected as shown below:

Column 5, line 36, delete "inputs;" and insert therefore -- inputs: --.
Column 5, line 39, delete "outputs;" and insert therefore -- outputs: --.
Column 5, line 42, delete "inputs;" and insert therefore -- inputs: --.
Column 5, line 48, delete "inputs;" and insert therefore -- inputs: --.
Column 6, line 13, delete "gale" and insert therefore -- gate --.
Column 6, line 23, delete "as" and insert therefore -- is --.
Column 7, line 10, delete "mud" and insert therefore -- and --.
Column 7, line 16, delete "inputs;" and insert therefore -- inputs: --.
Column 7, line 20, delete "outputs;" and insert therefore -- outputs: --.
Column 7, line 24, delete "inputs;" and insert therefore -- inputs: --.
Column 7, line 28, delete "output;" and insert therefore -- output: --.
Column 7, line 31, delete "inputs;" and insert therefore -- inputs: --.
Column 7, line 36, delete "spend" and insert therefore -- speed --.
Column 7, line 43, delete "us" and insert therefore -- its --.
Column 7, line 50, delete "anode" and insert therefore -- a node --.

This certificate supersedes Certificate of Correction issued July 10, 2007.

Signed and Sealed this

Thirty-first Day of July, 2007

JON W. DUDAS  
*Director of the United States Patent and Trademark Office*